United States Patent
Earm et al.

(10) Patent No.: US 7,531,792 B2
(45) Date of Patent: May 12, 2009

(54) ANALYZING CHAMBER INCLUDING A LEAKAGE ION BEAM DETECTOR AND MASS ANALYZER INCLUDING THE SAME

(75) Inventors: Hyun-Sub Earm, Hwaseong-si (KR);
Seung-Se Lee, Yongin-si (KR);
Young-Dae Kim, Yongin-si (KR);
Gon-Su Kang, Gumi-si (KR);
Sung-Yeul An, Gyeongju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 220 days.

(21) Appl. No.: 11/489,437

(22) Filed: Jul. 20, 2006

(65) Prior Publication Data
US 2007/0018093 A1 Jan. 25, 2007

(30) Foreign Application Priority Data
Jul. 22, 2005 (KR) .................. 10-2005-0066517

(51) Int. Cl.
*B01D 59/44* (2006.01)
*H01J 49/00* (2006.01)
*H01J 1/50* (2006.01)
*A61N 5/00* (2006.01)
*G21F 5/00* (2006.01)
*G21F 1/00* (2006.01)
*G21F 3/00* (2006.01)
*G21F 7/00* (2006.01)
*G21C 11/00* (2006.01)

(52) U.S. Cl. ................. 250/281; 250/299; 250/396 ML; 250/492.2; 250/515.1

(58) Field of Classification Search ................. 250/281, 250/287, 289, 291, 299, 300, 396 ML, 397, 250/492.2, 515.1; 315/210
See application file for complete search history.

(56) References Cited

U.S. PATENT DOCUMENTS

| | | | |
|---|---|---|---|
| 5,801,386 A | * | 9/1998 | Todorov et al. ............. 250/397 |
| 6,909,102 B1 | * | 6/2005 | Buccos ................... 250/492.21 |
| 2003/0155503 A1 | * | 8/2003 | Murphy et al. .............. 250/286 |

FOREIGN PATENT DOCUMENTS

| | | |
|---|---|---|
| KR | 1998-11827 | 4/1998 |
| KR | 10-2000-0014884 | 3/2000 |
| KR | 10-2005-0030010 | 3/2005 |

* cited by examiner

*Primary Examiner*—Jack I Berman
*Assistant Examiner*—Brooke Purinton
(74) *Attorney, Agent, or Firm*—Harness, Dickey & Pierce, P.L.C.

(57) ABSTRACT

In an analyzing chamber for a mass analyzer, a body of the analyzing chamber may include an inlet through which an ion beam enters and an outlet through which the ion beam leaves. A shielding section may be installed on a sidewall. The shielding section may prevent the ion beam traveling along a path in the body from causing damage to the sidewall of the body. A detector may be interposed between the sidewall of the body and the shielding section. The detector may detect an ion beam leaking through the shielding section. Accordingly, damage to the sidewall of the body may be sufficiently reduced and/or prevented.

25 Claims, 6 Drawing Sheets

ANALYZING CHAMBER INCLUDING A LEAKAGE ION BEAM DETECTOR AND MASS ANALYZER INCLUDING THE SAME

PRIORITY STATEMENT

This application claims the benefit of priority under 35 U.S.C. § 1.119 to Korean Patent Application No. 2005-66517 filed on Jul. 22, 2005, the entire contents of which is herein incorporated by reference.

BACKGROUND OF THE INVENTION

1. Field of the Invention

Example embodiments of the present invention relate to an analyzing chamber and a mass analyzer including the same. In particular, example embodiments of the present invention relate to an analyzing chamber including a leakage ion beam detector for detecting a leak in a guide protecting a sidewall of the chamber, and a mass analyzer including the same.

2. Description of the Related Art

Generally, semiconductor devices are manufactured by a series of unit processes including, for example, a photolithography process, an etching process, a diffusion process, an ion implantation process, a polishing process, cleaning and drying processes, etc. One or more of the processes may be selectively and repeatedly performed on a semiconductor substrate such as a wafer, for example. Among the above unit processes, the ion implantation and the diffusion processes may affect the electrical characteristics of the wafer the most.

In an ion implantation process, a sufficient energy to penetrate a surface of the wafer may be applied to a plurality of ions and the ions may be implanted into the surface of a wafer at a depth. A conventional ion implantation process may be used to facilitate density control of the impurities implanted into the wafer and to accurately control the implantation depth of the impurities. Accordingly, an ion implantation process may be widely used for manufacturing a highly integrated semiconductor device.

FIG. 1 is a view schematically illustrating a structure of a conventional ion implanter.

Referring to FIG. 1, a conventional ion implanter 90 may include an ion source unit 10, a beam line assembly 20, an end station unit 30, a driving unit 50 and a control unit 40. In the ion source unit 10, an impurity gas may be ionized into a plurality of impurity ions and a high energy may be applied to the impurity ions to generate an ion beam. The beam line assembly 20 may guide the ion beam from the ion source unit 10 to a destination through a predetermined path. The end station unit 30 may accurately position a target wafer, and the driving unit 50 may drive the target wafer. The control unit 40 may systematically control the ion source unit 10, the beam line assembly 20, the end station unit 30 and the driving unit 50. Each of the above units may be connected to the control unit through a data line 7 and a control line 8, for example.

The beam line assembly 20 may include a mass analyzer 23, a gate valve 21, an ion accelerator 25 and a deflection unit 27. The mass analyzer 23 may extract ions from an ion beam passing through a magnetic field based on a mass/charge ratio of each ion. The gate valve 21 may be interposed between the ion source unit 10 and the mass analyzer 23 and may selectively allow a generated ion beam to travel into the mass analyzer 23. The ion accelerator 25 may accelerate the extracted ions from the mass analyzer 23, and the deflection unit 27 may substantially uniformly scan the accelerated ions onto the wafer.

Impurity material may be supplied to the ion source unit 10 of the ion implanter 90 in a gaseous state and may be ionized into a plurality of charged particles. A high energy may be applied to the charged particles in the ion source unit 10 so that the charged particles leave the ion source unit 10 as an ion beam moving at a high velocity. Then, the gate valve 21 may be opened and desired ions may be selected in and pass through the mass analyzer 23. The desired ions may be implanted into a top surface of the wafer after traveling through the ion-accelerator 25 and the deflection unit 27. The wafer may be positioned in the end station unit 30.

FIG. 2A is a perspective view illustrating a conventional mass analyzer shown in FIG. 1, and FIG. 2B is a plan view illustrating the conventional mass analyzer shown in FIG. 2A.

Referring to FIGS. 2A and 2B, a conventional mass analyzer 23 may include an analyzing chamber 23a for changing the direction of travel of the ion beam irradiated thereto, a shielding section 23b for protecting a sidewall of the analyzing chamber 23a from the high-energy ion beam and a magnet (not shown) installed in the analyzing chamber 23a and generating a magnetic field for extracting ions from the ion beam.

The analyzing chamber 23a may include an inlet I and an outlet E. The longitudinal direction of the inlet I may be different from the longitudinal direction of the outlet E. The ion beam may enter the analyzing chamber 23a through the inlet I and ions may be selected in the analyzing chamber 23a. Accordingly, only desired ions leave the analyzing chamber 23 through the outlet E in the longitudinal outlet direction, which may be different from the longitudinal inlet direction. In a conventional analyzing chamber 23a, the outlet longitudinal direction is perpendicular to the inlet longitudinal direction and thus, the conventional analyzing chamber 23a may have the shape of a capital letter 'L'. Accordingly, in a conventional analyzing chamber 23a, the direction of travel of the ion beam may be perpendicularly changed in the analyzing chamber 23a.

The shielding section 23b may be arranged on an inner sidewall of the analyzing chamber 23a and may prevent an ion beam from causing damage to the inner sidewall of the analyzing chamber 23a. The shielding section 23b may include a plurality of shield partitions, which may be individually inserted into a groove one by one such that all of the inner sidewall of the analyzing chamber 23a may be covered with the shielding section 23b. For example, the shielding section 23b may include graphite such as black lead, for example, so that the ion beam may be adsorbed onto the shielding section 23b.

An ion beam entering the analyzing chamber 23a through the inlet I may be deflected, travel along an arc-shaped path R and leave the analyzing chamber 23a through the outlet E based on a direction of a magnetic field generated by the magnet. Some of the charged particles, each of which may have a mass smaller than that of the desired ions, may travel along a path L in the analyzing chamber 23 and thus, may be adsorbed onto the shielding section 23b. Further, other charged particles, each of which may have a mass greater than that of the desired ions, may travel along a path H in the analyzing chamber 23 and thus, may be adsorbed onto the shielding section 23b. Accordingly, only the desired ions leave the analyzing chamber 23a.

Accordingly, as the conventional mass analyzer 23 is repeatedly operated, the graphite of the shielding section 23b may gradually wear away due to collisions with the ion beam and a hole may be generated on an inner surface of the shielding section 23b. As a result, the inner sidewall of the analyzing chamber 23 may be partially exposed through the hole, and the ion beam may be irradiated onto the inner sidewall of the analyzing chamber 23 and may cause damage to the inner sidewall of the analyzing chamber 23. The damage to the inner sidewall of the analyzing chamber 23 may deteriorate the vacuum degree of the analyzing chamber 23a so that the desired ions can no longer be accurately extracted from the damaged conventional mass analyzer 23. If the shield partitions are not accurately arranged on the inner sidewall of the analyzing chamber 23a and a chink 27 is generated between neighboring shield partitions, the inner sidewall of the analyzing chamber 23a may not be completely covered with the shield partitions and the inner sidewall of the analyzing chamber 23a may be exposed to an ion beam. Accordingly, damage 28 may be caused to the inner sidewall of the analyzing chamber 23.

FIG. 3 is a view illustrating a chink between neighboring shield partitions in a conventional analyzing chamber, and FIG. 4 is a view illustrating damage to the inner sidewall of the analyzing chamber, which may be caused by an ion beam leaking through the chink shown in FIG. 3.

SUMMARY OF THE INVENTION

Example embodiments of the present invention provide an analyzing chamber for detecting an ion beam leaking through a shielding section to reduce and/or prevent damage to the inner sidewall of the analyzing chamber.

Example embodiments of the present invention provide a mass analyzer including a mass analyzer for detecting an ion beam leaking through of a shielding section to reduce and/or prevent damage to the inner sidewall of the analyzing chamber.

An example embodiment of the present invention provides an analyzing chamber for a mass analyzer. The analyzing chamber may include a body, a shielding section and a detector. The body may include an inlet through which an ion beam enters the analyzing chamber, an outlet through which the ion beam leaves the analyzing chamber, and a space for a path along which the ion beam travels from the inlet to the outlet. The shielding section may be arranged on a sidewall defining the space of the body, and may reduce and/or prevent the ion beam traveling along a path in the body from causing damage to the sidewall of the body. The detector may be interposed between the sidewall of the body and the shielding section and may detect a leakage ion beam leaked through the shielding section from the space of the body.

An example embodiment of the present invention provides a mass analyzer. The mass analyzer may include an analyzing chamber, a magnet and a power supply. The analyzing chamber may include a body having a space for a path along which an ion beam travels, a shielding section for preventing the ion beam traveling along a path from causing damage to a sidewall defining the space, and a detector for detecting a leakage ion beam leaked through the shielding section from the space. The magnet may generate a magnetic field in the analyzing chamber, and the power supply may supply electrical power to the analyzing chamber and the magnet.

According to an example embodiment of the present invention, the shielding section may be installed along the inner sidewall of the analyzing chamber in one body so that damage caused by a leakage ion beam passing through an arrangement failure of the shielding section, such as a chink, for example, is sufficiently reduced and/or prevented. In addition, the detector may be interposed between the shielding section and the sidewall of the body of the analyzing chamber so that damage caused by a leakage ion beam passing through a hole due to the wearing out of the shielding section may be sufficiently reduced and/or prevented from reaching the sidewall of the body of the analyzing chamber.

An example embodiment of the present invention provides a detector. The detector may include a pad, which may be interposed between a shielding section and sidewall of an analyzing chamber, for generating an electrical signal based on an intensity of an ion beam leaking through the shielding section.

BRIEF DESCRIPTION OF THE DRAWINGS

The above and other features and advantages of the present invention will become readily apparent to one skilled in the art by considering the following detailed description in conjunction with the accompanying drawings, in which.

DESCRIPTION OF EXAMPLE EMBODIMENTS OF THE PRESENT INVENTION

Figure 1:
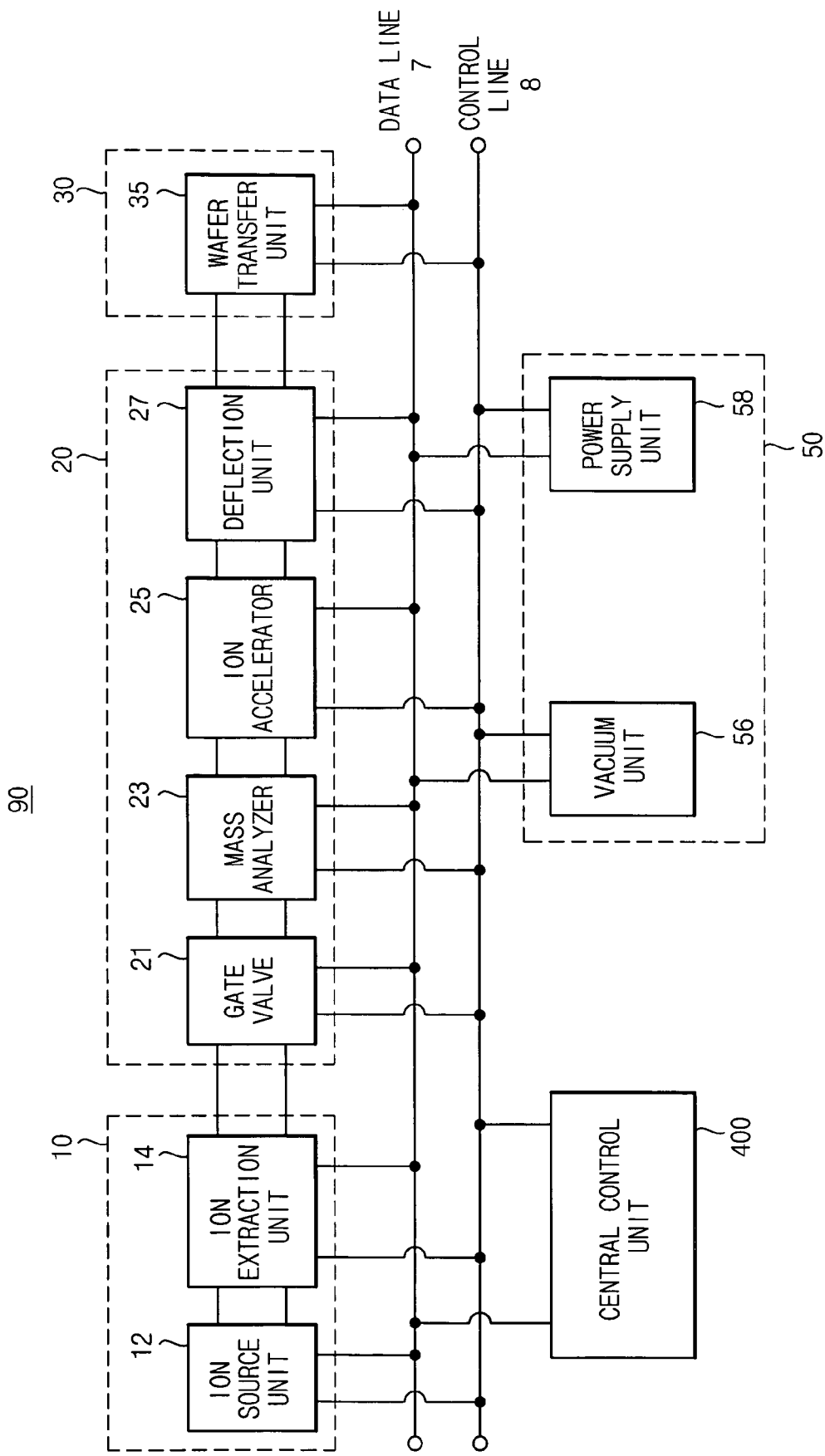
FIG. 1 is a view schematically illustrating a structure of a conventional ion implanter.
Figure 2A:
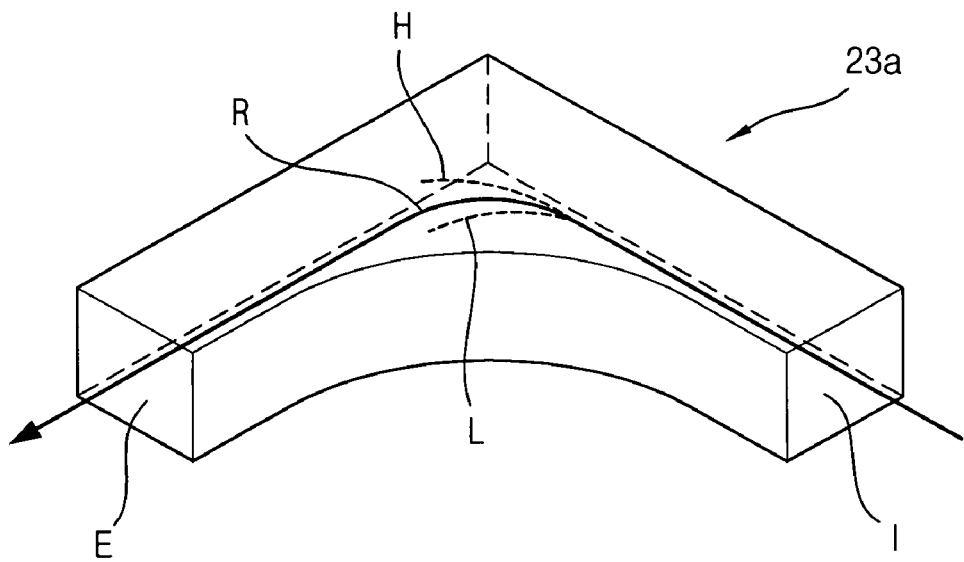
FIG. 2A is a perspective view illustrating a conventional mass analyzer.
Figure 2B:
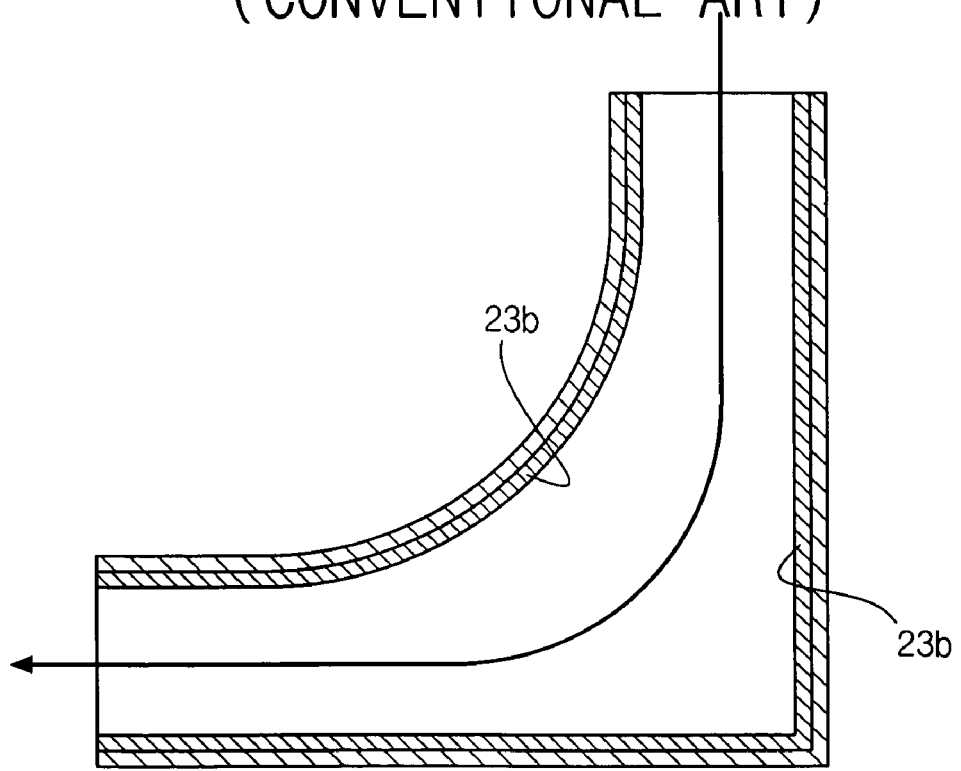
FIG. 2B is a plan view illustrating the conventional mass analyzer shown in FIG. 2A.
Figure 3:
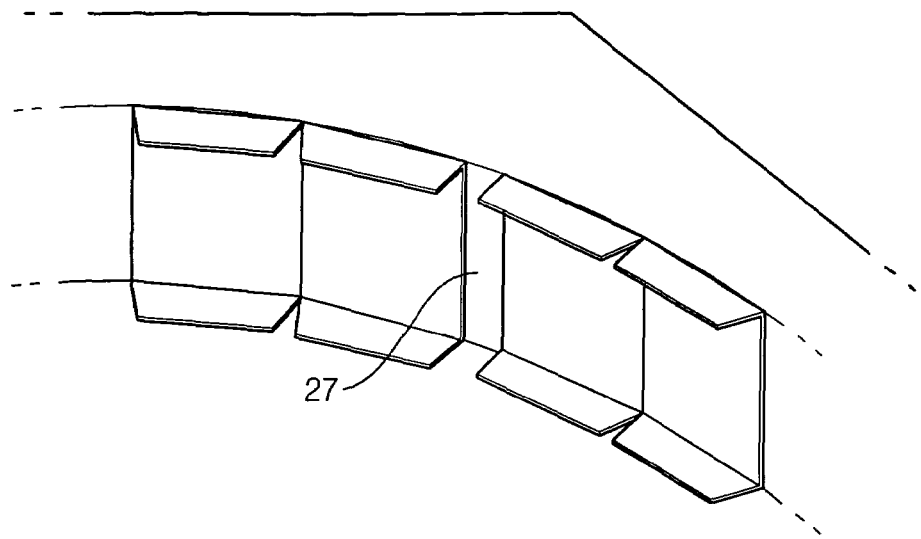
FIG. 3 is a view illustrating a chink between neighboring shield partitions in a conventional analyzing chamber.
Figure 4:
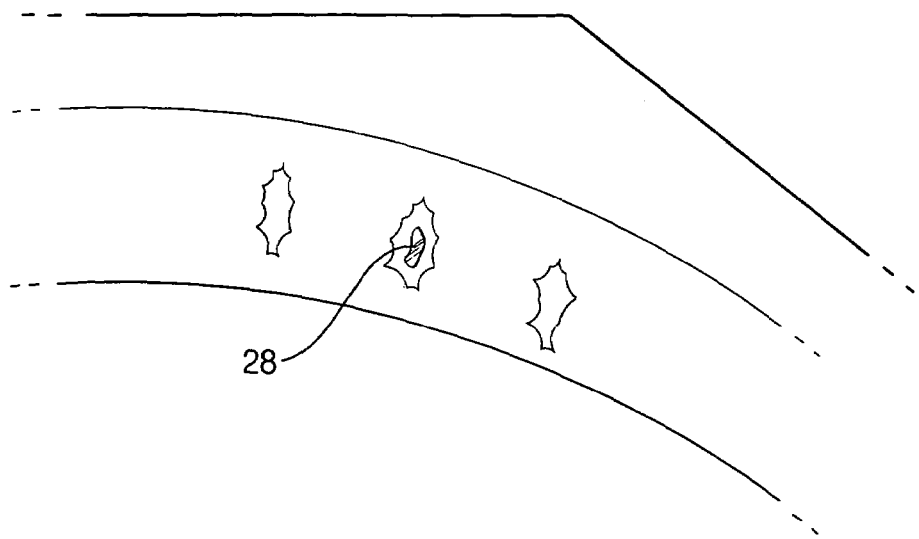
FIG. 4 is a view illustrating damage to the inner sidewall of the conventional analyzing chamber caused by an ion beam leaking through the chink shown in FIG. 3.

The invention is described more fully hereinafter with reference to the accompanying drawings, in which example embodiments of the present invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5A:
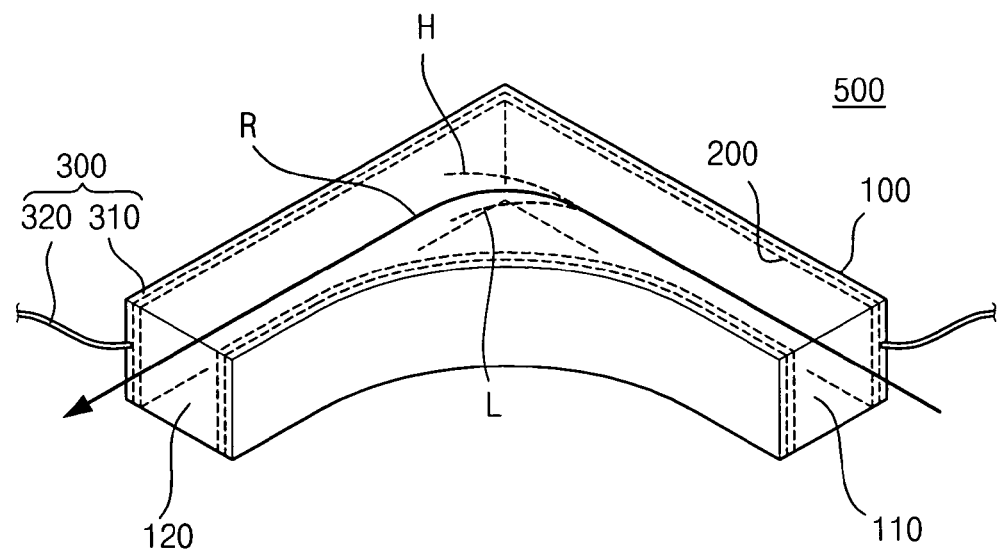
FIG. 5A is a perspective view illustrating an analyzing chamber for a mass analyzer according to an example embodiment of the present invention.
Figure 5B:
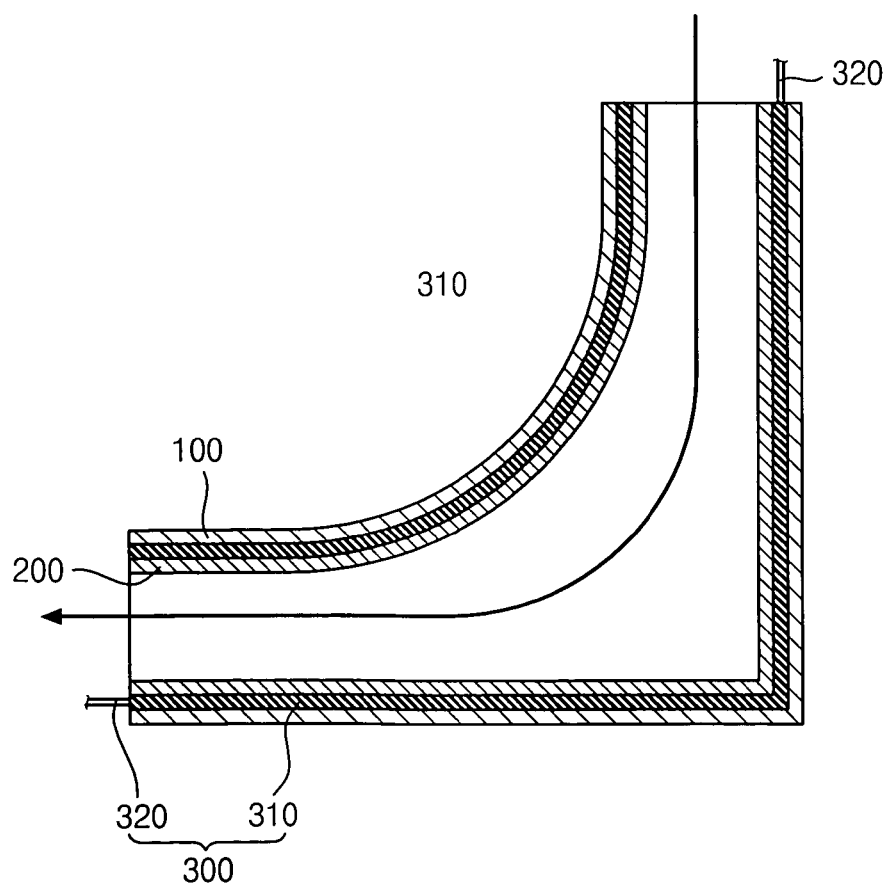
FIG. 5B is a plan view illustrating the analyzing chamber shown in FIG. 5A.

FIG. 5A is a perspective view illustrating an analyzing chamber 500 for a mass analyzer according to an example embodiment of the present invention, and FIG. 5B is a plan view illustrating the analyzing chamber shown in FIG. 5A.

Referring to FIGS. 5A and 5B, an analyzing chamber 500 of an example embodiment of the present invention may include a body 100, a shielding section 200 and a detector 300. The body 100 may provide a space for a path along which an ion beam may travel from an ion source unit. The shielding section 200 may reduce and/or prevent damage to the inner sidewall 140 in FIG. 6B of the body 100, which may be caused by the ion beam. The detector 300 may detect if an ion beam leaks through the shielding section 200.

The body 100 may include an inlet 110 through which the ion beam may enter the analyzing chamber 500 in a first direction and an outlet 120 through which the ion beam may leave the analyzing chamber 500 in a second direction. The first direction may be different than the second direction. The inlet 110 may be connected to an ion source unit. An impurity gas may be supplied the ion source unit and may be ionized into high-energy charged particles, thereby generating an ion beam. As a result, the ion beam may enter into the body 100 of the analyzing chamber 500 through the inlet 110 from the ion source unit. According to an example embodiment of the present invention, the body 100 may include aluminum or an aluminum alloy, for example.

The ion beam entering the body 100 through the inlet 110 may be deflected by a magnetic field in the analyzing chamber, may travel along an elliptical locus R in the body 100, and may leave the analyzing chamber 500 through the outlet 120. The locus of the ion beam may be varied in accordance with an intensity of the magnetic field so that desired charged particles having a desired mass leave the analyzing chamber 500, whereas other charged particles, each of which may have a mass smaller or greater than the desired charged particles, may be adsorbed onto the shielding section 200 arranged on an inner sidewall of the space of the body 100. In an example embodiment of the present invention, the space of the body 100 may be set to be a high vacuum degree for accurate analysis and/or extraction of a desired ion beam. Accordingly, the inlet 110 and the outlet 120 may be sufficiently closed from surroundings during operation of the analyzing chamber 500 to maintain the space of the body 100 under the high vacuum degree. According to an example embodiment of the present invention, the first direction of the inlet 110 may cross the second direction of the outlet 120 at an angle within a range of about 70° to about 90°. As such, the ion beam traveling in the first direction through the inlet 110 may be deflected at an angle within a range of about 70° to about 90°, to thereby leave the analyzing chamber 500 in the second direction through the outlet 120.

Charged particles, which may have a mass greater than that of the desired ions, may travel along a path L in the space of the body 100 and thus, may be adsorbed onto a first portion of the shielding section 23b. Other charged particles, which may have a mass smaller than that of the desired ions, may travel along a path H in the space of the body 100 and thus, may be adsorbed onto a second portion of the shielding section 200. Accordingly, the desired ions, of which an atomic weight is appropriate for ion implantation, may leave the analyzing chamber 500.

An ion beam includes a plurality of high-energy charged particles, so that repeated collisions of the ion beam with an inner sidewall 140 of the space of the body 100 may cause damage to the inner sidewall 140 of the space of the body 100 and may reduce the vacuum degree of the space of the body 100. At least in part due to the above reason, the shielding section 200 may be arranged on the inner sidewall 140 of the body 100 to reduce and/or prevent a direct collision of the ion beam with the sidewall 140 of the body 100.

The shielding section 200 may include graphite including carbon (C), such as black lead, for example, so the high-energy charged particles may be sufficiently adsorbed onto the shielding section 200. That is, the adsorption of the shielding section 200 may reduce and/or prevent the direct collision of the ion beam against the sidewall 140 of the body 100 and thus, may reduce and/or prevent damage to the sidewall 140 of the body 100 caused by the ion beam in the analyzing chamber 100. According to an example embodiment of the present invention, the shielding section 200 may include a plurality of shield plates, which may be sequentially arranged on the sidewall 140 of the body 100. Accordingly, the plurality of shield plates may be arranged similar to a belt surrounding the space of the body 100. According to an example embodiment of the present invention, the body 100 may also include a guide line for guiding and/or arranging the shield plates. According to an example embodiment of the present invention, one or all of the plurality of shield plates may be easily replaced if one or more of the shield plates are damaged.

Figure 6A:
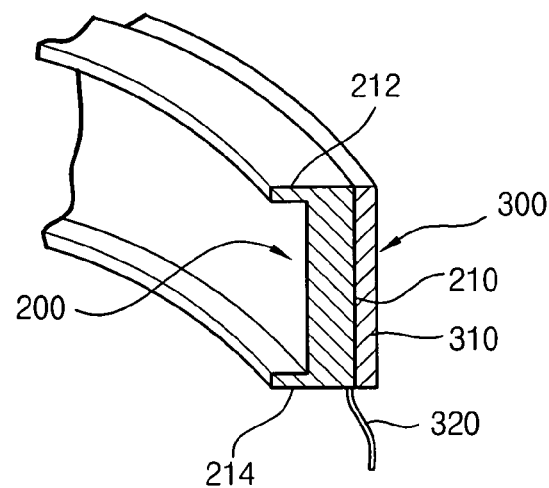
FIG. 6A is a perspective view illustrating a shielding section and a pad for detecting an ion beam according to an example embodiment of the present invention.
Figure 6B:
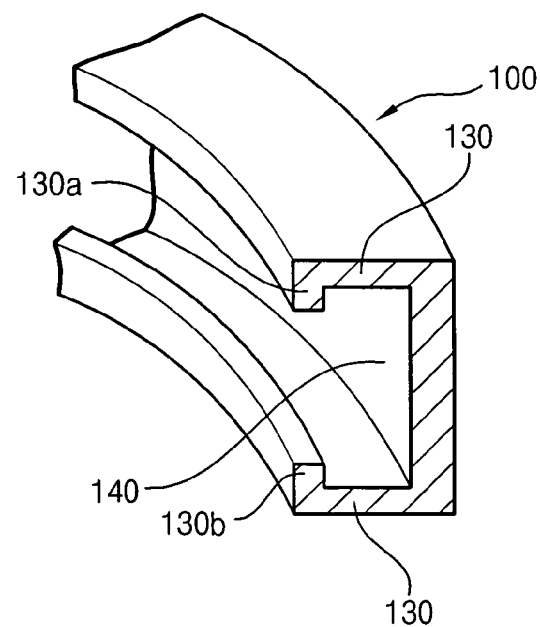
FIG. 6B is a perspective view illustrating a sidewall of a body including the guide line for arranging the shielding section according to an example embodiment of the present invention.

FIG. 6A is a perspective view illustrating a shielding section 200 and a pad 300 for detecting the ion beam according to an example embodiment of the present invention, and FIG. 6B is a perspective view illustrating a sidewall 140 of a body 100 including the guide line 130 for arranging the shielding section 200.

Referring to FIG. 6A, the shielding section 200 includes a plurality of shield plates, which may be shaped into a belt including a flexible material. For example, the shielding section 200 may include a plate 210 facing the sidewall 140 of the body 100 to protect the sidewall 140 of the body 100 from the ion beam and a pair of fixation portions 212 and 214, which may be used for fixing and/or arranging the plate 210 along the sidewall 140 of the body 100. The plate 210 may include black lead including carbon (C), for example, so that an ion beam traveling toward the sidewall 140 of the body 100 may be adsorbed onto the plate 210.

Referring to FIG. 6B, the body 100 may also include a guide line 130, which may protrude from a surface of the sidewall 140, and guide the shield plate along the sidewall 140 of the body 100. According to an example embodiment of the present invention, the guide line 130 may include a pair of supports 130a and 130b formed on the guide line 130 in a body and protrude from top and bottom end portions of the guide line 130 towards each other into the space of the body 100.

The shield plate 210 may be arranged from the inlet 110 to the outlet 120 along the guide line 130 and parallel with the sidewall 140 of the body 100 so that the sidewall 140 of the body 100 may be sufficiently protected from the ion beam. If the shield plate 210 is worn away due to repeated collisions with the ion beam and a hole is generated on the surface of the shield plate, the ion beam may leak through the hole and may cause damage to the sidewall 140 of the body 100. According to an example embodiment of the present invention, the shield plate 210 may be replaced, thereby reducing maintenance costs of the analyzing chamber 500. According to an example embodiment of the present invention, the guide line 130 and the fixation portions 212 and 214 may be relatively moveable with respect to each other to facilitate maintenance.

While the example embodiment of the present invention illustrated in FIG. 6A shows a belt-shaped shielding plate, a plurality of shielding partitions or any other configurations known to one of ordinary skill in the art may also be utilized in place of or in conjunction with the belt-shaped shielding plate. If the shielding partitions are utilized in place of the belt-shaped shielding plate, a size of the partition may be varied in accordance with facilities of manipulation and installation of the analyzing chamber.

According to an example embodiment of the present invention, an ion beam leaking through a hole on a surface of the shielding section 200 may be detected by the detector 300. The detector 300 may include a pad 310 and a signal line 320. The pad 310 may detect the ion beam leakage and may generate an electrical signal based on the intensity of the leakage ion beam. The signal line 320 may transfer the electrical signal.

According to an example embodiment of the present invention, the pad 310 may be interposed between the shielding section 200 and the sidewall 140 of the body 100. Although the leakage ion beam may pass through the hole of the shielding section 200, the pad 310 detects the leakage ion beam and generates an electrical signal corresponding to the intensity of the leakage ion beam before the ion beam reaches the sidewall 140 of the body 100 according to an example embodiment of the present invention. The pad 310 may include a photodiode for generating an electrical signal corresponding to the intensity of the leakage ion beam. Accordingly, if the leakage ion beam reaches a surface of the photo diode, a plurality of electrons may be discharged in proportion to the intensity of the leakage ion beam based on a photoelectric effect.

According to an example embodiment of the present invention, the pad 310 may be installed on the body 100 using various methods on the condition that the pad 310 is interposed between the shielding section 200 and the sidewall 140 of the body 100. For example, the pad 310 may enclose a whole surface of the sidewall 140 of the body 100, or may enclose a portion of the surface of the shielding section 200. According to an example embodiment of the present invention, the pad 310 may be detachably installed on the surface of the shielding section 200 so that the pad 310 may be easily detached from the shielding section 200 and replaced.

According to an example embodiment of an analyzing chamber 500, the shielding section 200 may be formed in a belt shape so that leakage of ion beam through an arrangement defect, such as a chink of the shielding section, for example, may be reduced and/or prevented. In addition, the detector may be interposed between the shielding section and the sidewall of the body so that the leakage ion beam, which may result from the wearing out of the shielding section, may be detected in advance.

Figure 7:
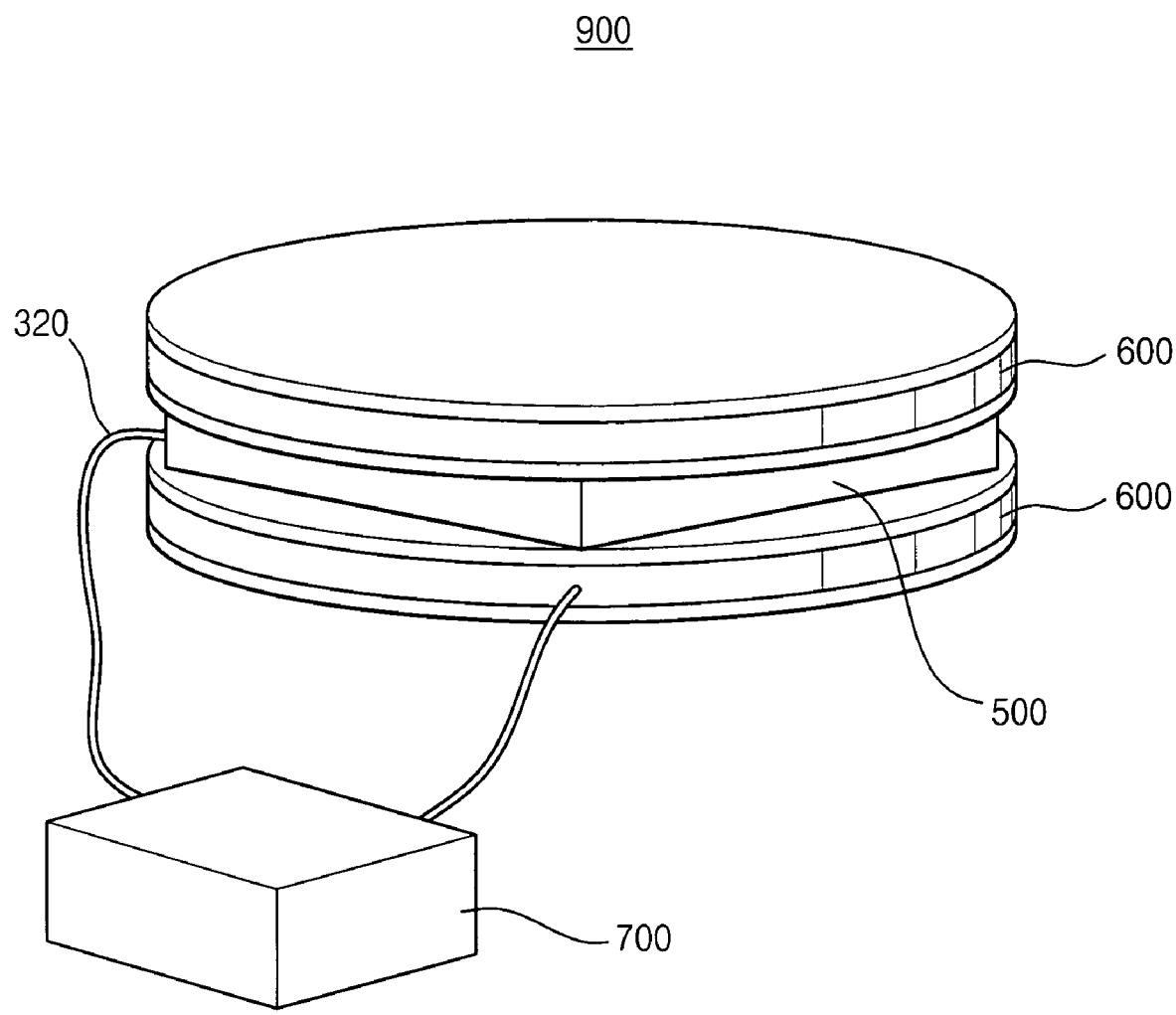
FIG. 7 is a perspective view illustrating a mass analyzer according to an example embodiment of the present invention, which includes the analyzing chamber shown in FIG. 5A.

FIG. 7 is a perspective view illustrating a mass analyzer 900 according to an example embodiment of the present invention including the analyzing chamber 500 shown in FIG. 5A.

Referring to FIG. 7, the mass analyzer 900 may include an analyzing chamber 500, power supply 700 and a magnet 600. The analyzing chamber 500 may extract a desired ion beam from an incident ion beam in accordance with a mass of the charged particles of the ion beam. The magnet 600 may generate a magnetic field in the analyzing chamber 500, and a power supply 700 may supply electrical power to the analyzing chamber 500 and/or the magnet 600.

According to an example embodiment of the present invention, the analyzing chamber 500 may include a body 100, a shielding section 200 and a detector 300. The body 100 may provide a space for a path along which the ion beam may travel from an ion source unit. The shielding section 200 may reduce and/or prevent damage to the inner sidewall 140 in FIG. 6B of the body 100 caused by the ion beam leakage. The detector 300 may detect a leakage ion beam, which has leaked through the shielding section 200. The analyzing chamber 500 may be substantially the same as described with reference to FIGS. 4A to 5B. Accordingly, a further detailed description of the analyzing chamber 500 is omitted herein for the sake of brevity.

The body 100 may include an inlet 110 through which the ion beam may enter the analyzing chamber 500 in a first direction and an outlet 120 through which the ion beam may leave the analyzing chamber 500 in a second direction. The first direction may be different than the second direction. The ion beam entering into the body 100 through the inlet 110 may be deflected by a magnetic field within the analyzing chamber, may travel along a curved locus in the body 100, and may leave the analyzing chamber 500 through the outlet 120. According to an example embodiment of the present embodiment, the first direction of the inlet 110 may cross the second direction of the outlet 120 at an angle within a range of about 70° to about 90°. Accordingly, the ion beam traveling in the first direction through the inlet 110 may be deflected at the angle within a range of about 70° to about 90° to leave the analyzing chamber 500 through the outlet 120. The shielding section 200 may include a flexible material and at least one belt-shaped shield plate. The body 100 may also include a guide line 130 that may protrude from the sidewall 140 for guiding the shield plate. The shield plate may be arranged from the inlet 110 to the outlet 120 along the guide line 130 parallel with the sidewall 140 of the body 100 so that the sidewall 140 of the body 100 may be sufficiently protected from the ion beam. According to an example embodiment of the present invention, the shielding plate 200 may include black lead including carbon (C), for example. The detector 300 may include a pad 310 and a signal line 320. The pad 310 may detect the leakage of an ion beam through the shielding plate 200 and may generate an electrical signal in accordance with an intensity of the leakage ion beam. The signal line 320 may transfer the electrical signal. According to an example embodiment of the present invention, the pad 310 is interposed between the shielding section 200 and the sidewall 140 of the body 100. If the leakage ion beam passes through a hole in the shielding section 200, the pad 310 may detect the leakage ion beam and generate an electrical signal corresponding to the intensity of the leakage ion beam before the ion beam reaches the sidewall 140 of the body 100. According to an example embodiment of the present invention, the pad 310 may include a photodiode for generating an electrical signal corresponding to the intensity of the leakage ion beam. The signal line 320 may be connected to the power supply 700. According to an example embodiment of the present invention, if the leakage ion beam leaks through the shielding section 200 and is detected by the detector 300, the power supply 700 may cut off power to the analyzing chamber 500 and/or the magnet 600.

According to an example embodiment of the present invention, the magnet 600 may generate a magnetic field in a direction perpendicular to a longitudinal direction of the analyzing chamber 500. The ion beam may be analyzed in accordance with a mass of each of the charged particles of the ion beam in the analyzing chamber 500 so that a desired ion beam may leave the analyzing chamber 500. That is, the desired ion beam may leave the analyzing chamber 500 at a constant velocity based on the mass of the charged particles and an intensity of the magnetic field. Charged particles, each of which may have a mass smaller or greater than that of the charged particles of the desired ion beam, may not escape from the analyzing chamber 500 and may be adsorbed onto the shielding section 200 in the analyzing chamber 500. According to an example embodiment of the present invention, the magnet 600 may include an electromagnet. In this case, the magnet 600 may be operated by the power supply 700 simultaneously with the analyzing chamber 500. However, according to an example embodiment of the present invention, the magnet 600 may also include a permanent magnet as long as the permanent magnet generates a sufficient intensity of a magnetic field. The sufficient intensity would be known to one of ordinary skill in the art.

The power supply 700 may supply electrical power to the analyzing chamber 500 and/or the magnet 600 to operate the mass analyzer 900. The power supply 700 may include a controller (not shown), a control line (not shown) and a power source (not shown). The controller may control the power supplied to the analyzing chamber 500 and/or the magnet 600. The control line may transfer control signals between the controller and the power source. The signal line 320 of the detector 300 may be connected to the control line. As such, an electrical signal indicating the ion beam has leaked through the shielding section 200 may be transferred to the controller through the control line. If the electrical signal is transferred to the controller, the controller may deactivate the power supply to the analyzing chamber 500 so the ion beam no longer enters into the body 100 of the analyzing chamber 500. Accordingly, damage to the sidewall 140 of the body 100 of the analyzing chamber 500 due to the leakage ion beam in advance may be sufficiently reduced and/or prevented.

The mass analyzer 900 according to an example embodiment of the present invention may be operated as follows.

An impurity gas may be supplied to the ion source unit and a high energy may be applied to the impurity gas so that the impurity gas is ionized into a plurality of high-energy charged particles to generate an ion beam. The generated ion beam may enter the analyzing chamber 500 through the inlet 110 of the body 100. An intensity of a magnetic field due to the magnet 600, an intensity of an electrical field due to the ion beam and an initial velocity of the ion beam may be set to a value. The value may be a predetermined constant value according to an example embodiment of the present invention. In this case, force equilibrium may be maintained between an electric force and a magnetic force in the analyzing chamber 500 so that desired charged particles, each of which may have a mass satisfying the force equilibrium, leave the analyzing chamber 500. Other charged particles, each of which may have a mass incompatible with the force equilibrium, may collide with the shielding section 200 arranged on the sidewall 140 of the body 100 of the analyzing chamber 500. The shielding section 200 may include graphite such as black lead, for example, and thus, particles colliding with the shielding section 200 may chemically react with the graphite and disappear in the analyzing chamber 500. Repeated operation of the mass analyzer may increase the chemical reaction of the ion beam and the graphite so that the graphite may be gradually worn away, thereby generating a hole on a surface of the graphite. If the ion beam in the analyzing chamber 500 leaks through the hole in the shielding section 200, the leakage ion beam may be detected by the detector 300. The detector may transfer an electrical signal corresponding to the intensity of the leakage ion beam to the power supply 700. The controller may deactivate a power supply of the analyzing chamber 500 and/or magnet 600. Accordingly, the ion beam may no longer enter the analyzing chamber 500 and the magnetic field within the analyzing chamber 500 may disappear to reduce and/or prevent damage to the sidewall 140 of the body 100 of the analyzing chamber 500, which may be caused by the leakage ion beam. If the power supply to the analyzing chamber 500 is deactivated, the defective shielding section may be removed from the guide line 130 and a nondefective shielding section may be installed into the guide line 130 of the body 100 in place of the defective shielding section.

According to an example embodiment of the present invention, the shielding section 200 may be installed along the inner sidewall 140 of the analyzing chamber in one body 100 so that damage due to an ion beam leaking through an arrangement failure of the shielding section 200, for example, a chink, may be sufficiently reduced and/or prevented. In addition, the detector 300 may be interposed between the shielding section 200 and the sidewall 140 of the body 100 of the analyzing chamber 500 so an ion beam leaking through a hole due to the wearing out of the shielding section 200 may be detected and action may be taken to reduce and/or prevent the leakage ion beam from causing damage to the sidewall 140 of the body 100 of the analyzing chamber 500. In addition, defects in the analyzing chamber may be reduced and/or prevented in advance according to an example embodiment of the present invention and the desired ions appropriate for an ion implantation process may be effectively extracted from the analyzing chamber 500.

Although example embodiments of the present invention have been described, it is understood that the present invention should not be limited to these example embodiments. Instead, various changes and/or modifications can be made by one skilled in the art without departing from the spirit and scope of the present invention.

What is claimed is:

1. An analyzing chamber for a mass analyzer, comprising:
   a body including an inlet through which an ion beam enters the analyzing chamber and an outlet through which the ion beam leaves the analyzing chamber;
   a shielding section arranged on a sidewall defining a space of the body; and
   a detector interposed between the sidewall of the body and the shielding section, the detector detecting an ion beam leaking through the shielding section.

2. The analyzing chamber of claim 1, wherein a path along which the ion beam travels from the inlet to the outlet is included in the space.

3. The analyzing chamber of claim 1, wherein a direction of the inlet and a direction of the outlet form an angle, and the ion beam enters into the analyzing chamber in the direction of the inlet and leaves the analyzing chamber in the direction of the outlet, which is different from the direction of the inlet.

4. The analyzing chamber of claim 3, wherein the direction of the inlet and the direction of the outlet form an angle within a range of about 70° to about 90°.

5. The analyzing chamber of claim 1, wherein the body includes at least aluminum.

6. The analyzing chamber of claim 1, wherein the shielding section includes a flexible material and at least one shield plate.

7. The analyzing chamber of claim 1, wherein the at least one shield plate is belt-shaped.

8. The analyzing chamber of claim 6, wherein the body further includes a guide line that protrudes from the sidewall of the body and guides the at least one shield plate so the at least one shield plate is arranged from the inlet to the outlet along the guide line parallel with the sidewall of the body.

9. The analyzing chamber of claim 8, wherein the guide line is formed on the sidewall of the body and includes a pair of supports protruding from end portions of the guide line towards each other, and the shield plate includes a pair of fixation portions corresponding to the pair of the supports.

10. The analyzing chamber of claim 6, wherein the shielding section includes black lead including carbon (C).

11. The analyzing chamber of claim 1, wherein the detector includes a pad detecting the ion beam leaking through the shielding section and generating an electrical signal corresponding to an intensity of the ion beam leaking through the shielding section, and a signal line transferring the electrical signal.

12. The analyzing chamber of claim 11, wherein the pad is interposed between the shielding section and the sidewall of the body and detects the ion beam leaking through the shielding section before the ion beam reaches the sidewall of the body.

13. The analyzing chamber of claim 11, wherein the pad is detachably installed on a surface of the shielding section.

14. The analyzing chamber of claim 11, wherein the pad includes a photo diode that generates an electrical signal in proportion to an intensity of the ion beam leaking through the shielding section.

15. A mass analyzer comprising:
    the analyzing chamber according to claim 1;
    a magnet generating a magnetic field in the analyzing chamber; and
    a power supply supplying electrical power to the analyzing chamber and the magnet.

16. The mass analyzer chamber of claim 15, wherein the detector includes a pad detecting the ion beam leaking through the shielding section and generating an electrical signal corresponding to an intensity of the ion beam leaking through the shielding section, and a signal line transferring the electrical signal.

17. The mass analyzer of claim 16, wherein the signal line is connected to the power supply and the power supply cuts off power to the analyzing chamber and the magnet when the ion beam leaking through the shielding section is detected by the detector.

18. The mass analyzer of claim 15, wherein the magnet includes an electromagnet.

19. The mass analyzer of claim 15, wherein a direction of the inlet through which the ion beam enters the analyzing chamber form an angle and direction of the inlet is different from the direction of the outlet.

20. The mass analyzer of claim 19, wherein the direction of the inlet and the direction of the outlet form an angle within a range of about 70° to about 90°.

21. The mass analyzer of claim 15, wherein the shielding section includes a flexible material and at least one shield plate.

22. The mass analyzer of claim 21, wherein the body further includes a guide line that protrudes from the sidewall of the body and guides the at least one shield plate so the at least one shield plate is arranged from the inlet to the outlet along the guide line parallel with the sidewall of the body.

23. The mass analyzer of claim 21, wherein the shielding section includes black lead including carbon (C).

24. The mass analyzer of claim 16, wherein the pad is interposed between the shielding section and the sidewall of the body and detects the leakage ion beam before the ion beam reaches the sidewall of the body.

25. The mass analyzer of claim 24, wherein the pad is detachably installed on a surface of the shielding section, and wherein the pad includes a photo diode that generates an electrical signal in proportion to an intensity of the ion beam leaking through the shielding surface.

* * * * *